United States Patent [19]

Müller

[11] Patent Number: 4,657,170
[45] Date of Patent: Apr. 14, 1987

[54] PROCESS FOR BONDING AN ELECTRIC COMPONENT TO A BLOCK OF CONNECTING TAGS AND A MACHINE AND TAPE FOR CARRYING OUT THIS PROCESS

[75] Inventor: Claude Müller, Le Locle, Switzerland

[73] Assignee: Farco, S.A., Le Locle, Switzerland

[21] Appl. No.: 787,552

[22] Filed: Oct. 15, 1985

[30] Foreign Application Priority Data

Oct. 16, 1984 [FR] France ................................. 84 15944

[51] Int. Cl.⁴ ...................... B23K 31/00; B23K 37/04; H01L 21/00
[52] U.S. Cl. .................................... 228/106; 228/5.5; 29/576 S
[58] Field of Search .............. 228/106, 6.2, 5.5, 180.2; 29/576 S, 589

[56] References Cited

U.S. PATENT DOCUMENTS 3,696,985  10/1972  Herring et al. ........................ 29/589
3,901,429  8/1975  Boyer et al. .......................... 228/5.5
4,050,618  9/1977  Angelucci et al. ................... 228/6.2
4,283,839  8/1981  Gursky ................................... 29/589

Primary Examiner—Nicholas P. Godici
Assistant Examiner—Samuel M. Heinrich
Attorney, Agent, or Firm—Pollock, Vande Sande & Priddy

[57] ABSTRACT

In a process for bonding simultaneously a series of juxtaposed connecting terminals of an electric component to a connecting tag block, one tag per terminal, by the application of a bonding tool to the respectively superposed tags and terminals, the bonding tool is applied to the superposed tags and terminals through a sheet of ductile, heat conducting material. This sheet is made preferably in the form of a tape moving in synchronism with a tape carrying blocks of the tags. The two tapes are guided and driven in guide blocks placed each side of a work station carrying the components to be bonding. The tape of ductile material can serve as a protective strip for the tape equipped with the bonded components.

11 Claims, 6 Drawing Figures

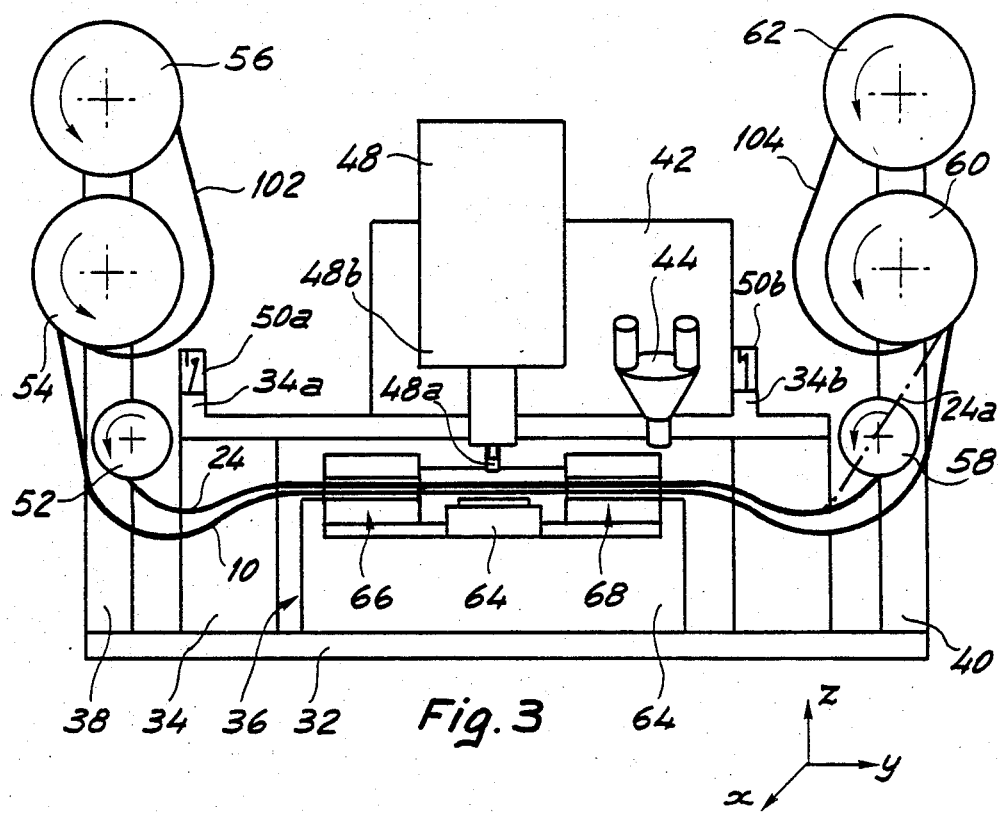
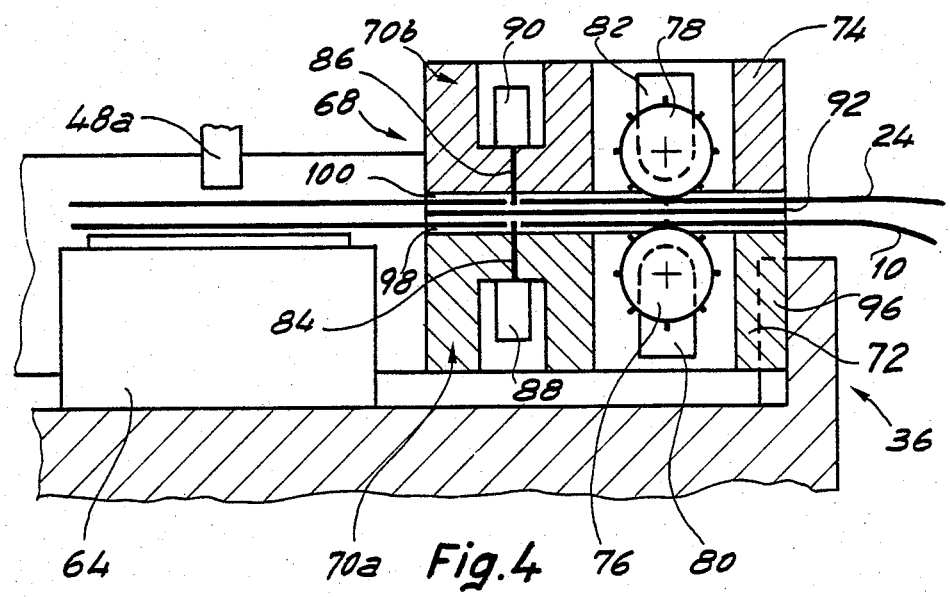

PROCESS FOR BONDING AN ELECTRIC COMPONENT TO A BLOCK OF CONNECTING TAGS AND A MACHINE AND TAPE FOR CARRYING OUT THIS PROCESS

BACKGROUND OF THE INVENTION

The present invention relates to a process for bonding an electric component to a block or set of connecting tags. It also relates to a machine and tape for carrying out this operation. More particularly, it relates to a process for bonding a series of juxtaposed connecting terminals or pads of an electric component to a block of connecting tags, one tag per terminal, by the application of a bonding tool to the respectively superposed tags and terminals.

This process is frequently used for bonding an integrated circuit onto a block of connecting tags. In this case it is known as ILB (Inner Lead Bonding).

PRIOR ART

For carrying out this process there exist known machines such as those sold by the applicant (assignee) under the brand name FARCO (Registered Trade Mark), ref. F12O, F22O or F32O. These machines comprise a bonding tool and a support for positioning and holding a block of tags and an integrated circuit, in relation to each other and in alignment with the bonding tool.

According to this process, the integrated circuit's connecting terminals and the connecting tags are bonded simultaneously, one tag per terminal, by the application of the bonding tool on the respectively superposed tags and terminals.

Although this process has been perfected for bonding integrated circuits comprising a few dozen terminals, when the number is higher, it poses problems which are difficult to solve. It has in fact been noted that when the amount of bonding to be carried out is increased the risk of the integrated circuit substrate breaking increases considerably. These breakages seem to be due to the fact that the tolerances of the contact elements (or terminals), the conducting tracks (or connecting tags) and the bonding tool tips lead to an unequal distribution of pressure between the contacts, the maximum pressure being the greater, the greater the number of contacts.

The object of the present invention is to solve this problem.

STATEMENT OF THE INVENTION

The above object is achieved by the interposition of a sheet of ductile, heat conducting material between the bonding tool and the superposed tags and terminals, the material having a melting point above the temperature which the tool reaches during the bonding operation.

Thanks to this process, and mainly because of the presence of the sheet of ductile, heat conducting material, the pressure and the heat applied at the time of bonding are better distributed over the terminals of the component, which prevents especially the breakage of the latter. It is thus possible to bond an electric component to a block of connecting tags in a reliable and economic manner, even if the component has a large number of terminals.

In a specific method of carrying out the process according to the invention it is additionally possible to protect the component and the tag block after the bonding operation, at low cost, as the sheet of ductile material can serve subsequently as a protecting element for the component.

BRIEF DESCRIPTION OF THE DRAWINGS

The invention will be better understood by reading the following description, made with regard to the drawings provided purely by way of example. In these drawings:

FIG. 3 shows diagrammatically a machine for carrying out the process according to the invention;

FIGS. 4 and 5 illustrate the details of this machine.

DESCRIPTION OF EMBODIMENTS

Figure 1:
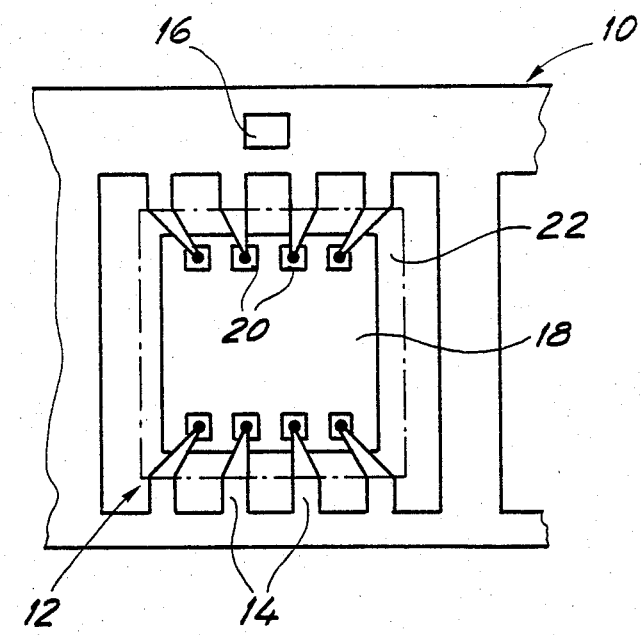
FIG. 1 shows part of a tape having a series of connecting tag blocks and a component.

In FIG. 1 part of a tape 10 may be seen, comprising a series of blocks 12 of connecting tags 14, and some cutouts 16. This tape is analogous to cinema film, the cutouts 16 corresponding to the sprocket holes of the film, while the tag blocks occupy positions equivalent to that of photographic film frames. An electric or electronic component such as an integrated circuit 18 is bonded by its terminals 20 onto the inner ends of the connecting tags 14. The set thus formed of a block of connecting tags and an integrated circuit can subsequently be covered with a protective coating 22 of plastics material (shown by the line of dots and dashes),- the tags 14 protruding beyond its outer edges. To be used, the set is then separated from the tape 10 by cutting the outer ends of the tags 14.

In FIG. 1 the set comprises only eight connections. It goes without saying that in practice this number can be much higher. It can reach several dozen and may even exceed one hundred. If the bonding technique known as ILB poses no particular problem when the set comprises twenty or thirty connections the same can not be said when the number exceeds a hundred. It has in fact been noted that, as the number of connections increases, so the risk of the integrated circuits breaking increases. These breakages seem to be due to the fact that the tolerances of the terminals, the conductor tags and the tips of the bonding tool lead to an unequal distribution between the contacts of the pressure which is applied to them at the time of bonding, the maximum value of this pressure being the greater, the greater the number of contacts. The pressure applied may then be applied to only a few terminals (the highest for example) the others receiving only a little pressure, or even none at all.

According to the invention, the number of breakages can be considerably reduced by the interposition of a sheet of ductile, heat conducting material between the bonding tool and the superposed tags and terminals, the material having a melting point superior to the temperature which the tool reaches during bonding. It has been found that where the bond is of the gold-tin type an aluminum, sheet constitutes an advantageous choice.

Figure 2:
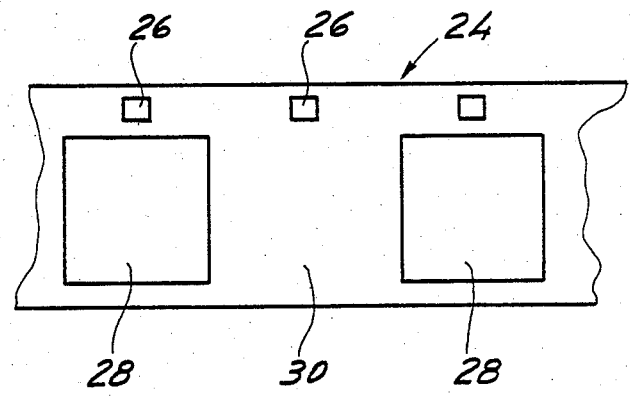
FIG. 2 shows part of a tape of a ductile, good heat conducting material for carrying out the process.

FIG. 2 shows a tape taking the place of an inserted sheet and which can be used with a slight modification of the existing machine used up to now for the ILB technique.

In this figure the tape is made of an aluminium sheet 24 which resembles a cinema film and has perforations 26 and alternating windows 28 and solid sections 30, at a ratio of two holes 26 per window 28 and solid section 30. The holes 26 are on one side of the tape and serve to drive it. The windows 28 and the solid sections 30 are arranged after the fashion of film frames.

FIG. 3 shows a machine according to the invention. Certain details are illustrated in a more complete manner in FIGS. 4 and 5. This machine comprises a base 32 on which there rests a bed 34, a work support 36 and two columns 38 and 40. The bed 34 carries a carriage 42 on which are mounted an optical instrument 44 and a bonding tool 48. This carriage can move along the Y axis of the system of coordinates shown in FIG. 3, where the Y and Z axes are located in the plane of the drawing while the X axis is perpendicular to this plane. The movement of the carriage is limited by two stops 34a and 34b, which are integral parts of the bed 34. This bed carries, furthermore, two contacts shown diagrammatically as 50a and 50b, the function of which will be described more precisely later on.

The stops 34a and 34b are positioned in such a way that, when the carriage is resting against one of them the optical instrument 44 or the bonding tool respectively are at right angles to the area where the bonding is being carried out.

The bonding tool 48 comprises two tips 48a, only one of which is shown in FIG. 3, as well as a current generator 48b, intended to heat the tips by the Joule effect. The lens of the optical instrument 44 and the tips 48a are perfectly aligned along the Y axis in relation to the tags and terminals to be bonded.

The column 38 carries two supply spools 52 and 54 and one take-up reel 56. The column 40 carries two take-up reels 58 and 60 and one supply spool 62.

Figure 5:
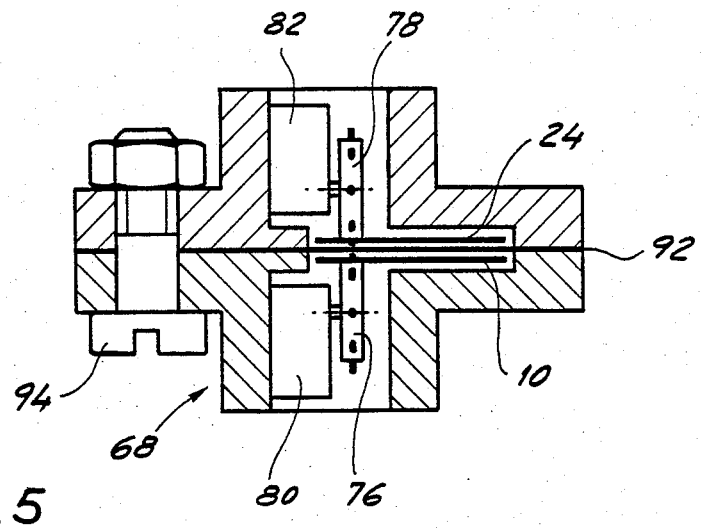

As may be seen in more detail in FIGS. 4 and 5 a table 64 and two guide blocks 66 and 68 for the tape 10 and 24 are located on the support 36. These blocks are arranged either side of the table 64, the function of which is to hold in position the integrated circuits. It is constituted advantageously of an X-Y plotter table of which the part supporting the integrated circuits can move along the two X and Y axes and turn around the Z axis.

The guide block 68 comprises two guides 70a and 70b each of which has a frame 72, 74, a studded wheel 76, 78, a stepping motor 80, 82 for driving the studded wheel, a positioning pin 84, 86 and a positioning pin control 88, 90. The frames 72 and 74 are separated by a plate 92, these three parts being joined by means of screws, one of which, 94, is shown in FIG. 5. The guide blocks 66 and 68 are mounted slidingly along the Z axis on the support 36, by means of groove-slideway sets, one of which, 96, is shown in FIG. 4.

The plate 92 defines with the frame 72 a slit 98 and with the frame 74 a slit 100. The guide block 68 is made up in the same way as the block 66, although it can be withou drive and indexing members for the tapes 10 and 24.

Figure 6:
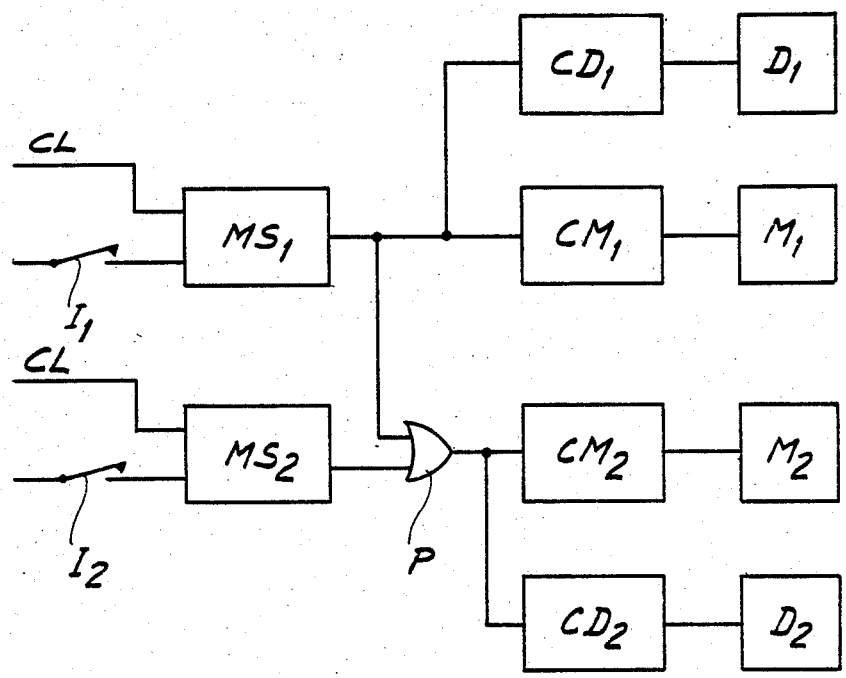
FIG. 6 shows a simplified control circuit diagram for this machine.

The forward movement of the tapes 10 and 24 is controlled by a control circuit such as the one shown in FIG. 6. This circuit includes two switches $I_1$ and $I_2$, two one-shot multivibrators $MS_1$ and $MS_2$, an OR gate P, two motor control circuits $CM_1$ and $CM_2$ controlling the motors $M_1$ and $M_2$ respectively, as well as two control circuits $CD_1$ and $CD_2$ for the positioning pins $D_1$ and $D_2$. In this circuit, the contact $I_1$ is equivalent to the switch 50a and the contact $I_2$ is equivalent to the switch 50b. The motors $M_1$ and $M_2$ are equivalent to the motors 80 and 82 respectively and the pins $D_1$ and $D_2$ are equivalent to the pins 84 and 86 respectively (see FIG. 4).

This circuit operates as follows. When the carriage 42 arrives at the stop 34a (optical instrument 44 aligned with the table 64), it closes the switch 50a. In this way the contact $I_1$ is closed, which causes a pulse to appear at the output of the multivibrator $MS_1$. This pulse commands the withdrawal of the pin $D_1$ by the control circuit $CD_1$ and the advance of the stepping motor $M_1$ through the control circuit $CM_1$. This same pulse controls the withdrawal of the pin $D_2$ and the stepping motor $M_2$ through the intermediary of the control circuits $CD_2$ and $CM_2$ via the OR gate P. The pulse in question thus has the effect of commanding simultaneously the freeing of the tapes 10 and 24 and their movement forward by one step, that is to say by the distance separating two holes 16 or 26.

When the carriage 42 is moved to the right it rests against the stop 34b so that the bonding tool is facing the table 64, the switch 50b being closed. In this way the contact $I_2$ (FIG. 6) is closed and the multivibrator $MS_2$ then generates a pulse which once again, but this time only, controls the motor $M_2$ and the withdrawal of the pin $D_2$ through the intermediary of the control circuits $CM_2$ and $CD_2$, via the OR gate P. The tape 24 then moves one more step while the other tape 10 remains motionless. The tape 10 is inserted in the slit 98 in order to present successive tag blocks in the space between the tips 48a and the table 64. To this end its upper part, which is still not equipped with bonded integrated circuits, is unwound from the spool 54, its lower part being stored on the take-up reel 60. So as to prevent the tape 10 from being damaged, either on the spool 54 or on the winding reel 60, protective strips 102 and 104 are inserted between the different layers of the tape 10. As the tape 10 unwinds from the spool 54, the strip 102 winds up on the winding reel 56. Conversely, as the tape 10 winds up on the winding reel 60 the strip 104 winds with it from the spool 62 onto the winding reel.

The tape 24 is inserted in the slit 100 also in order to appear in the space between the tape 10 and the bonding tips 48a. This tape unwinds from the spool 52 and winds after use onto the winding reel 58.

The integrated circuits are aligned and fixed so as to be removable, for example by means of a wax, on a glass plate positioned on the table 64.

In the process according to the invention, carried out by means of the machine shown in FIGS. 3 to 6, the carriage 42 is initially positioned against the stop 34a, so that the optical instrument 44 is above the table 64. The tape 10 is positioned in such a way that a block of connecting tags is in the field of the optical instrument 44 and the tape 24 is positioned so that a window 28 is above the block of connecting tags and the operator can see the tape 10 as well as one of the integrated circuits positioned on the table 64. The operator is thus able to align the integrated circuit, by moving the table 64 slightly along its X and Y axes, in relation to the tags of the tape 10, each connecting terminal of the integrated circuit then being located precisely below a connecting tag of the tape. When this adjustment has been completed, the operator moves the carriage up to the stop 34b. In this position the bonding tool 48 is perfectly aligned with this superposition of connecting members. Furthermore, the switch $I_2$ is closed. The closure of this switch has as result the appearance of a pulse at the output of the multivibrator $MS_2$, which causes the withdrawal of the positioning pin $D_2$ through the control circuit CD$_2$ and the advance by one step of the studded wheel 76 thanks to the pulse which the circuit CM$_2$ sends to the motor M$_2$. In this way, only the tape 24 advances by one step and a solid part 30 is interposed between the tag block of the tape 10 and the tips 48a. In this position the operator controls the bonding operation. This means that in a first stage the guide blocks 66 and 68 are lowered so that the tag block enters into contact with the integrated circuit terminals aligned with it. In a second stage the bonding tool is actuated and lowered so that it bonds simultaneously the series of juxtaposed connected terminals of the integrated circuit to the block of connecting tags, at a ratio of one tag per terminal, while a solid part 30 of the tape 24 of ductile, heat conducting material is interposed between the tool 48a and the superposed tags and terminals.

Practice has shown that to achieve satisfactory bonding the plates 48a of the bonding tool must be at a temperature approaching 500 deg. C., and the pressure applied must be between 10 and 80 g per connection, the period of application being around one second.

The application of the pressure has as aim the guaranteeing of a good contact between each of the connecting tags 14 and the terminals 20 of the integrated circuit 18. The sheet of ductile, heat conducting material interposed between the bonding tool and the connecting tags distributes the pressure very efficiently between the different bonding points by compensating for the dimensional tolerances (especially height) of the integrated circuit terminals. Furthermore, it ensures better distribution of the heat between the bonding points.

When the bonding operation is completed, the operator moves the bonding tool 48a, then moves the carriage 42, bringing it back to rest against the stop 34a. This causes the closure of the switch 50a, which in turn causes the withdrawal of the pins 84 and 86 to be commanded by a pulse generated by the multivibrator MS$_1$ and applied to the control circuits CD$_1$ and CD$_2$ and to the control circuits CM$_1$ and CM$_2$, these latter causing the rotation by one step of the motors M$_1$ and M$_2$. The two tapes 10 and 24 then move simultaneously one step, which brings about the coincidence of a new integrated circuit, a new window 28 and a connecting tag block 14 ready to be aligned.

The choice of aluminum for the tape 24 was made in empirical fashion. The tests carried out show that in order for the desired effect to be achieved, it is desirable that the material should have a melting point 80 to 250 deg. above the temperature reached by the parts of the bonding tool which come into contact with the film. At the time of these tests the temperature reached by the tips 48a was around 500 deg. C., while the melting point of aluminum is 658 deg. C.

In the unit shown in FIG. 3 the tape 24 is wound onto the winding reel 58 provided especially for that purpose. As a variant, however, it is possible to wind the two tapes 10 and 24 up together, the tape 24 taking the place of the protective strip. (See the dotted and dashed line 24a in FIG. 3). In this case it is advantageous for the tape 24 to comprise means designed to increase its apparent thickness, such as a plastics strip stuck to it or deformation by stamping, in order to prevent contact between integrated circuits from successive windings, even through the aluminium sheet.

In the example described, the integrated circuits have gold terminals and the connecting tags are tinplated, the sheet of ductile material being of aluminum. It goes without saying that other materials can be envisaged. However, the material from which the sheet of ductile, heat conducting material is made must be chosen according to the temperature which the bonding tool tips must reach in order to carry out their task.

The machine described mentions two tips 48a. This number can be any number. If the bonding tool has four of them arranged in a rectangle it is possible to carry out bonding on all four edges of the integrated circuit in a single operation.

The description makes reference to the bonding of an integrated circuit onto a connecting tag block. It goes without saying that other components, for example a display cell or a small ceramic plate itself having components, can be bonded in the same way, to any block of connecting tags, without in any way stepping outside the scope of the invention.

I claim:

1. A process for bonding simultaneously a series of juxtaposed connecting terminals of an electric component to a connecting tag block having one tag per terminal, said process comprising:

aligning said tag block and said electric component such that one of said tags respectively is superposed per one of said terminals;

interposing a sheet of ductile, heat conducting material between a bonding tool and said superposed tags and terminals, said material having a melting point above the temperature which said tool reaches at the moment of bonding;

applying heat and pressure to said respectively superposed tags and terminals by the application of said bonding tool to said interposed sheet; and, retaining said sheet against said tag block and said electric component to protect them after the bonding operation.

2. A process for bonding simultaneously a series of juxtaposed connecting terminals of an electric component to a connecting tag block having one tag per terminal, said process comprising:

aligning said tag block and said electric component such that one of said tags respectively is superposed per one of said terminals;

interposing a sheet of ductile, heat conducting material between a bonding tool and said superposed tags and terminals, said material having a telting point above the temperature which said tool reaches at the moment of bonding;

applying heat and pressure to said respectively superposed tags and terminals by the application of said bonding tool to said interposed sheet; and, carrying out a series of cycles of said aligning, interposing and applying steps during which a plurality of electric components are bonded successively to a plurality of connecting tag blocks spaced along a first tape;

said blocks being brought successively into alignment with respective electric components before the bonding operation by step-by-step feeding of said first tape, said interposed sheet being part of a second tape provided alternately with solid areas and cut-out areas;

said second tape being moved parallel to said first tape and before each bonding operation the two tapes being moved forward in synchronism so that a cut-out area of said second tape is aligned with said component and said block when these are aligned with each other;

and said second tape alone being moved on one step while said first tape is kept immobile so that a solid area of said second tape is brought opposite said component and aligned block to interpose a new sheet between said tool and said superposed tags and terminals before each bonding operation.

3. A process according to claim 2 wherein said aligning step includes optically aligning said terminals and said tags.

4. The process according to claim 2, wherein after the bonding operation said sheet is retained against the set of blocks and components to protect them.

5. The process according to claim 4, wherein said first tape is wound on to a take-up reel and said second tape is wound up at the same time onto said reel, to act as a protective layer interleaved between the successive turns of said first tape 6. The process according to claim 2, wherein the melting point of said material is 80° to 250° C. above the temperature reached by said bonding tool.

7. The process according to claim 2, wherein said material is aluminium.

8. A process for bonding simultaneously a series of juxtaposed connecting terminals of an electric component to a connecting tag block having one tag per terminal, said process comprising:
aligning said tag block and said electric component such that one of said tags respectively is superposed per one of said terminals;
interposing a sheet of ductile, heat conducting material between a bonding tool and said superposed tags and terminals, said material having a melting point above the temperature which said tool reaches at the moment of bonding;
applying heat and pressure to said respectively superposed tags and terminals by the application of said bonding tool to said interposed sheet;
carrying out a series of cycles of said aligning, interposing and applying steps during which a plurality of electric components are bonded successively to a plurality of connecting tag blocks spaced along a first tape, said blocks being brought successively into alignment with respective electric components before the bonding operation by step-by-step feeding of said first tape, and said interposed sheet being part of a second tape which moves parallel to said first tape and in synchronism with it so that before each bonding operation a new sheet is interposed between said tool and said superposed tags and terminals; and,
winding said first tape and said second tape onto a take-up reel at the same time so that said second tape acts as a protective layer interleaved between the successive turns of said first tape.

9. A machine for bonding simultaneously a series of juxtaposed connecting terminals of an electric component to a connecting tag block having one tag per terminal, said machine comprising:
means for aligning said tag block and said electric component at a bonding station such that one of said tags respectively is superposed per one of said terminals;
a bonding tool for applying heat and pressure to said respectively superposed tags and terminals by the application of said bonding tool to a sheet of a ductile, heat conducting material interposed between said bonding tool and said respectively superposed tags and terminals;
support means for positioning and holding said electric component and said block of tags in relation to each other and in line with said bonding tool at said bonding station, and for positioning and holding said sheet interposed between said bonding tool and said respectively superposed tags and terminals at said bonding station;
first feed means for moving through said bonding station a first tape formed with a plurality of spaced blocks of said tags;
second feed means for moving a second tape through said bonding station parallel to said first tape and between said bonding tool and said first tape, said second tape being provided alternately with solid portions and cut-out portions, and said solid portions comprising said sheet of ductile, heat conducting material; and,
step-by-step drive means operative to advance said first tape block by block for fresh bonding operations, and to advance said second tape in two steps for each of said bonding operations, one of said steps indexing said cut-out portion of said second tape into said bonding station and the other of said steps indexing said solid portion of said second tape into said bonding station.

10. A machine according to claim 9, characterized in that at least one edge of said second tape has holes to cooperate with said step-by-step drive means.

11. A machine according to claim 10, wherein the pitch between two of said solid portions is equal to the pitch between two of said cut-out portions and to a multiple of the distance between two of said holes.

* * * * *